United States Patent
Gassmann et al.

[11] Patent Number: 5,565,822
[45] Date of Patent: Oct. 15, 1996

[54] TEM WAVEGUIDE ARRANGEMENT

[75] Inventors: Felix Gassmann, Zürich; Henk Hoitink, Windisch; Rolf Müller, Urdorf; Hans Schär, Basel, all of Switzerland

[73] Assignee: ABB Management AG, Baden, Switzerland

[21] Appl. No.: 449,850

[22] Filed: May 24, 1995

(Under 37 CFR 1.47)

[30] Foreign Application Priority Data

May 27, 1994 [DE] Germany .................... 44 18 664.9

[51] Int. Cl.⁶ ........................................ H01P 1/26
[52] U.S. Cl. .................. 333/22 R; 342/1; 343/703
[58] Field of Search ............... 333/22 R, 81 A, 333/243, 245; 342/1, 4; 343/703

[56] References Cited

U.S. PATENT DOCUMENTS

| 4,837,581 | 6/1989 | Hansen et al. | 333/22 R X |
| 5,055,806 | 10/1991 | Hansen et al. | 333/22 R |
| 5,237,283 | 8/1993 | Carbonini | 333/22 R X |

FOREIGN PATENT DOCUMENTS

| 0363831B1 | 4/1990 | European Pat. Off. . |
| 0369273 | 5/1990 | European Pat. Off. . |
| 3503181 | 8/1986 | Germany . |
| 3931449 | 3/1990 | Germany . |

OTHER PUBLICATIONS

"Carborundum Non-Inductive Resistors", Product Information from The Carborundum Company, Niagara Falls, New York, 1981.

*Primary Examiner*—Paul Gensler
*Attorney, Agent, or Firm*—Burns, Doane, Swecker & Mathis

[57] ABSTRACT

In TEM waveguide arrangements such as are used in testing the electromagnetic compatibility of electronic devices in electromagnetic fields, a plate-shaped inner conductor is connected via electrically parallel-connected tubular resistors to an electrically conductive, spherical rear wall. This rear wall is electrically connected to an outer conductor and grounded. Radio-frequency absorbers are mounted on the rear wall for the purpose of absorbing TEM waves, the RF short-point absorbers adjacent to the tubular resistor being smaller than the remaining RF long-point absorbers, in order to reduce the capacitive influence of the tubular resistors. Identical tubular resistors are arranged perpendicular to the plane of the drawing of FIG. 1 in accordance with a current density distribution in such a way that they are more closely adjacent at the edge than in the middle of the inner conductor.

12 Claims, 2 Drawing Sheets 5,565,822

TEM WAVEGUIDE ARRANGEMENT

BACKGROUND OF THE INVENTION

1. Field of the invention

The invention relates to a TEM waveguide arrangement.

2. Discussion of Background

The invention refers with the preamble of patent claim 1 to a prior art as disclosed in EP-A1-0 246 544. A reflection-free termination is specified there for a TEM waveguide, in which a TEM wave is guided between an inner conductor and an outer conductor. Provided as line termination for the purpose of absorbing conductor-bound energy is an ohmic resistance which effects a gradual, serial damping of the inner conductor and locally compensates a capacitance per unit length additionally caused by RF absorbers for absorbing field-bound energy. Such TEM waveguide arrangements or waveguide cells serve to test electronic devices for their compatibility with reference to an external effect of electromagnetic fields, and to conduct broadband emission measurement, Defined field distributions can be set over a wide frequency range.

A disadvantage is the large outlay on parallel and series circuits for the terminators.

EP-B1-0 363 831 discloses a TEM waveguide arrangement having a TEM waveguide which widens in the shape of a pyramid and which has an asymmetrically arranged, plate-shaped inner conductor. The latter is led through an absorber wall, which is curved in the manner of a calotte, or hemispherical shape, and has pyramidal radio-frequency pointed absorbers, to a number of terminators. It is not possible at input powers above 1 kW for the heat produced at the termination of the inner conductor to be adequately dissipated. The compensation of the capacitance per unit length caused by the RF absorbers is unsatisfactory. Because of their method of production, the absorbers have excessively large tolerances in the range of ±50%.

For the relevant prior art, reference may also be made to a company brochure: The Carborundum Company, Electronic Ceramics Division, P.O. Box 664, Niagara Falls, N.Y. 14302, Form A-7049, dated 1981, which discloses low-inductance, tubular resistors which withstand temperatures up to 230° C. or 350° C. and peak voltages of up to 5 kV.

SUMMARY OF THE INVENTION

Accordingly, one object of the invention is to develop a TEM waveguide arrangement of the type mentioned at the beginning in such a way that it is suitable for input powers above 1 kW and can be realized at lower cost with respect to its line termination.

Advantageous embodiments of the invention are defined in the dependent patent claims.

One advantage of the invention consists in that far fewer resistors are required for the termination of the inner conductor. This reduces the outlay on production work, because of a lower number of welding or connecting operations. The space required for the resistors is less.

By observing a defined spacing of the tubular resistors from the absorbers, their capacitive influence can be minimized.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
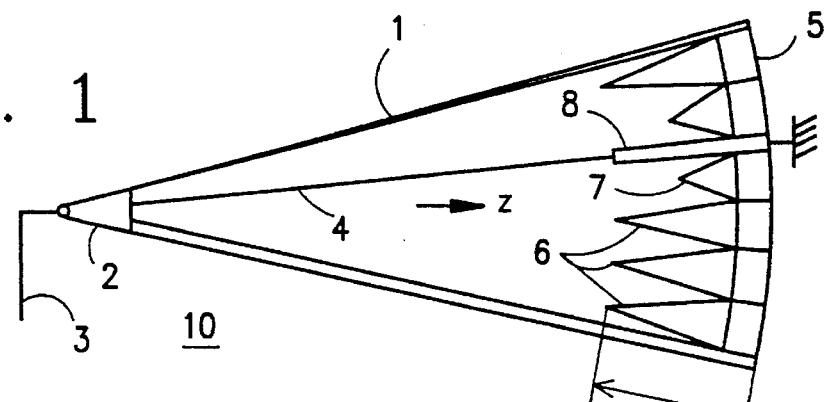
FIG. 1 shows a TEM waveguide arrangement having inner conductor, terminator and radio-frequency absorbers.

Referring now to the drawings, wherein like reference numerals designate identical or corresponding parts throughout the several views, FIG. 1 shows the essential parts of a TEM waveguide arrangement (10) having a metallic, grounded, frustopyramidal outer conductor (1), a plate-shaped partition wall, or an inner conductor (4), which is suspended asymmetrically therein on filaments (not represented) and is grounded at the edge via a tubular resistor (8) on a rear wall (5), a supply wedge (2), RF long-point absorbers (6) and RF short-point absorbers (7) which are laterally adjacent to the tubular resistor (8). A coaxial cable (3) feeds the supply wedge (2) with pulse-shaped or sinusoidal radio-frequency energy (RF), which wedge generates a transverse electromagnetic so-called TEM wave and launches it into the TEM waveguide arrangement (10). (T) designates an end region or transition region which is given by the length of the RF long-point absorber (6).

Figure 6:
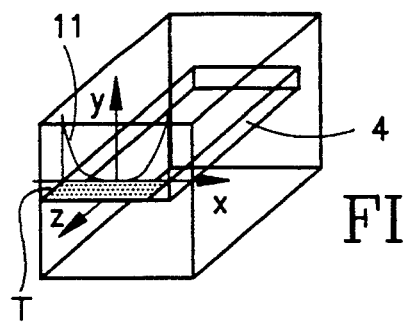
FIG. 6 shows a current distribution on the inner conductor in accordance with FIG. 1 transverse to the propagation direction of a TEM wave.
Figure 7:
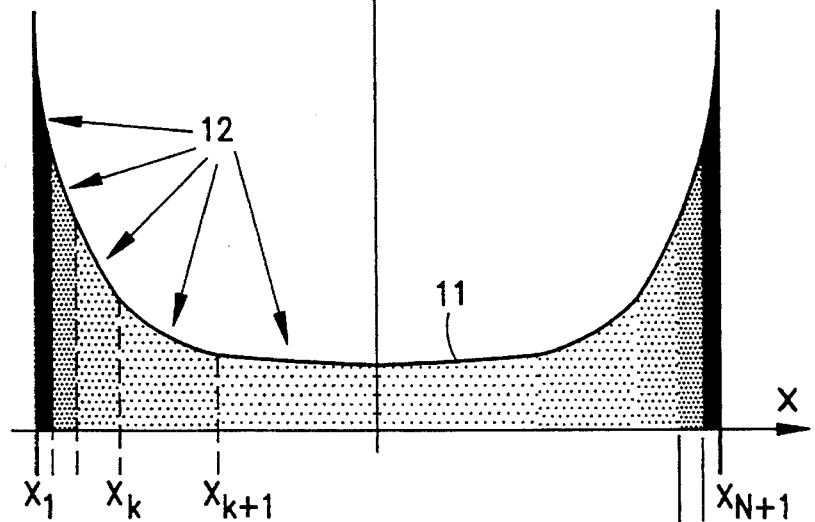
FIG. 7 shows a breakdown of the current distribution on the inner conductor in accordance with FIG. 5 into zones of equal current density.

The arrow drawn in indicates a direction of the TEM wave field designated by (z), compare also FIG. 6. In an x-direction perpendicular to the plane of the drawing of FIG. 1, a current flowing in the inner conductor has a course (11) of the current density (I(x)) as represented in FIGS. 6 and 7. The current density (I(x)) is higher at the edge than in the middle. Regions of equal current density (I(x)) are designated by (12). The x-coordinates are the boundaries of these regions (12) and are designated by ($x_1$, $x_k$, $x_{k+1}$, $x_{N-1}$, $x_N$, $x_{N+1}$).

Figure 8:
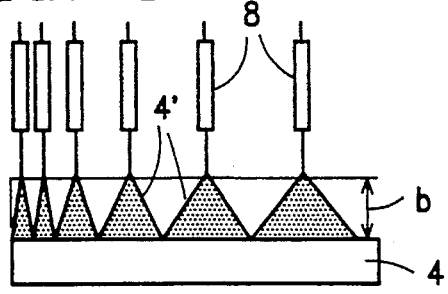
FIGS. 8 and 9 show transition zones of the inner conductor having a toothed structure.
Figure 9:
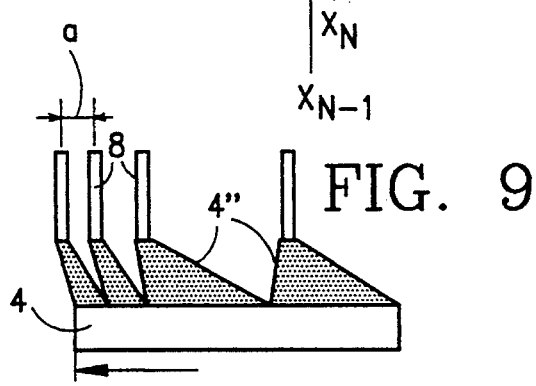

Only 1 tubular resistor (8) is to be seen in FIG. 1. In fact, a plurality of tubular resistors (8) are connected electrically in parallel perpendicular to the plane of the drawing, as is to be seen from FIGS. 8 and 9. The inner conductor (4) is constructed in a sawtooth fashion in the connecting region with the tubular resistors (8), the point of each sawtooth being connected to a tubular resistor (8) in a fashion which conducts electricity well. The sawtooth points are closer to one another at the edge than in the middle since the current density (I(x)) is higher at the edge than in the middle. Given tubular resistors (8) of the same dimensions, more energy is thus converted into heat at the edge than in the middle of the inner conductor (1). The spacing of adjacent tubular resistors (8) thus corresponds to the course (11) of the current density (I(x)). The sawtooth points can be constructed in a triangular fashion (4'), as represented in FIG. 8, or in trapezoidal fashion (4"), as is to be seen in FIG. 9. A depth (b) of the transition zone (4'), compare FIG. 8, is determined, on the one hand, by the size of the TEM waveguide arrangement (10) and, on the other hand, by the length of the tubular resistors (8), which depends in turn on the given maximum input power of the TEM waveguide arrangement (10).

The depth (b) is limited by the maximum permissible difference in the path lengths of the wave fronts of the current between the outer sides of a triangle and the perpendicular bisector of the triangle, which should not be larger than approximately $\lambda_{min}/10$. Here, $\lambda_{min}$ signifies the minimum TEM wavelength of, for example, 3 cm for a maximum operating frequency of 1 GHz. Adjacent tubular resistors (8) are to have a minimum lateral spacing (a), compare FIG. 9, in the range of 0.5 cm–1 cm, in order to permit adequate ventilation.

The tubular resistors (8) consist of a mixture of conductive and ceramic materials; they are commercially available with powers of up to 1 kW, compare the citation at the beginning with reference to tubular resistors. In an exemplary embodiment, 38 parallel-connected, identical resistors each of length 80 cm, diameter 2.5 cm and an output of 250 W were used for an input power of the TEM waveguide arrangement (10) of 10 kW and a maximum permissible surface temperature of the tubular resistors (8) of 120° C. The parallel-connected resistors (8) form a total resistance of 50Ω, the characteristic impedance of the inner conductor (4). The total resistance is always tuned to the characteristic impedance of the inner conductor (4), which can also, for example, be 60Ω. The length of the tubular resistors (8) is determined by the maximum power and the operating conditions. The end of the tubular resistors (8) is directly connected tothe metallic spherical rear wall (5) in a fashion which conducts well.

The radio-frequency absorbers (6, 7) are located on the widened end of the TEM waveguide arrangement (10); they run to a point in the interior thereof as 4-sided regular pyramids. The RF short-point absorbers (7) adjacent to the tubular resistor (8) exhibit a spacing from the tubular resistors (8), in order to minimize the capacitive influence of the latter and to guarantee ventilation; they are shorter than the RF long-point absorbers (6) further removed from the tubular resistor (8). The RF short-point absorbers (7) suppress reflections which would occur from the gaps between the RF long-point absorbers (6) in the event of said absorbers being absent. It is possible by means of these RF short-point absorbers (7) to produce very large TEM waveguide arrangements (10) having radio-frequency absorber points of length 3.75 m.

The dimensions of the overall termination composed of tubular resistors (8) and radio-frequency absorbers (6, 7) is particularly important for the transition frequency range at which its characteristic changes from a resistive into an absorbing state. The transition range in which the radio-frequency absorber (6, 7) begins to work, depends both on the size of the TEM waveguide arrangement (10) and on the termination itself. In the case of a standard TEM waveguide arrangement (10), this transition region is situated between 50 MHz and 200 MHz.

The TEM mode propagates in the TEM waveguide arrangement (10) as a spherical wavefront. All the points of the wavefront are at the same distance from the source, that is to say from the feed wedge (2). The phases of the instantaneous oscillation at the wavefront are all the same. Consequently, the rear wall (5) is preferably formed or constructed in a spherical fashion.

The inner conductor (4) and the outer conductor (1) must be electrically connected downstream of the radio-frequency absorbers (6, 7). The best results were obtained by placing the rear wall (5) directly downstream of the radio-frequency absorbers (6, 7). The resistor termination is thus led through the radio-frequency absorbers (6, 7) directly onto the rear wall (5) and electrically connected in a planar fashion, with the result that a very low inductive connection to the outer conductor (1) of the. TEM waveguide arrangement (10) is achieved.

The radio-frequency absorbers (6, 7) consist of polyurethane foam cut in a pyramidal shape. The foam is mixed, for example, with graphite or carbon powder, which effects the absorption of the electromagnetic energy. The various types of absorber are distinguished not only by their dimensions and shape, but also by the density of the carbon fraction. In the case of relatively low frequencies <100 MHz, the absorbing effect is slight and the radio-frequency absorber (6, 7) behaves like a dielectric. The tubular resistors (8) led through the radio-frequency absorbers (6, 7) thus experience a capacitive load which varies the impedance of the termination. Radio-frequency absorbers (6, 7) with a low carbon fraction have a lower imaginary component of the dielectric constant. Radio-frequency absorbers (6, 7) with a larger carbon fraction have a better absorptive effect at low frequencies. It has been shown that a lower capacitive effect of the radio-frequency absorbers (6, 7) is to be preferred to a high absorption at low frequencies.

Figure 2:
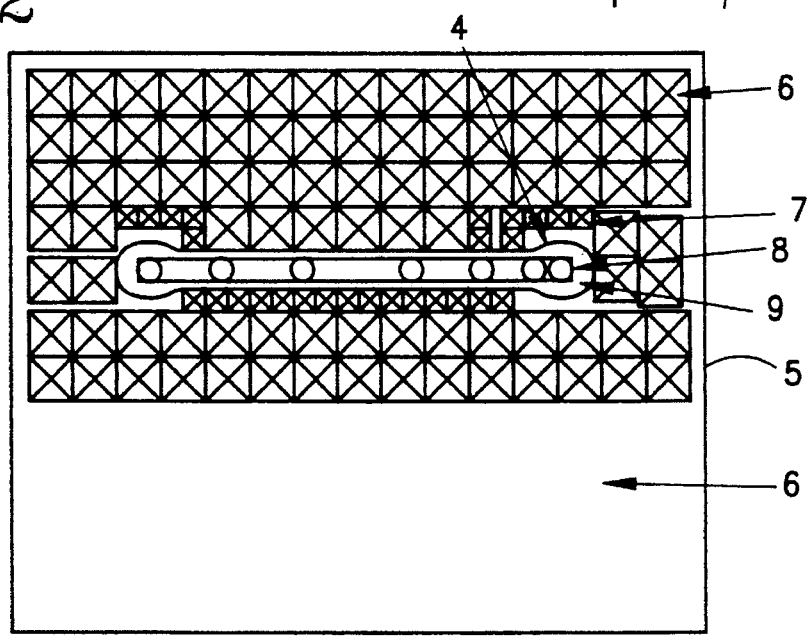
FIGS. 2 and 3 show details of plan views of radio-frequency absorbers in the region of the inner conductor.
Figure 3:
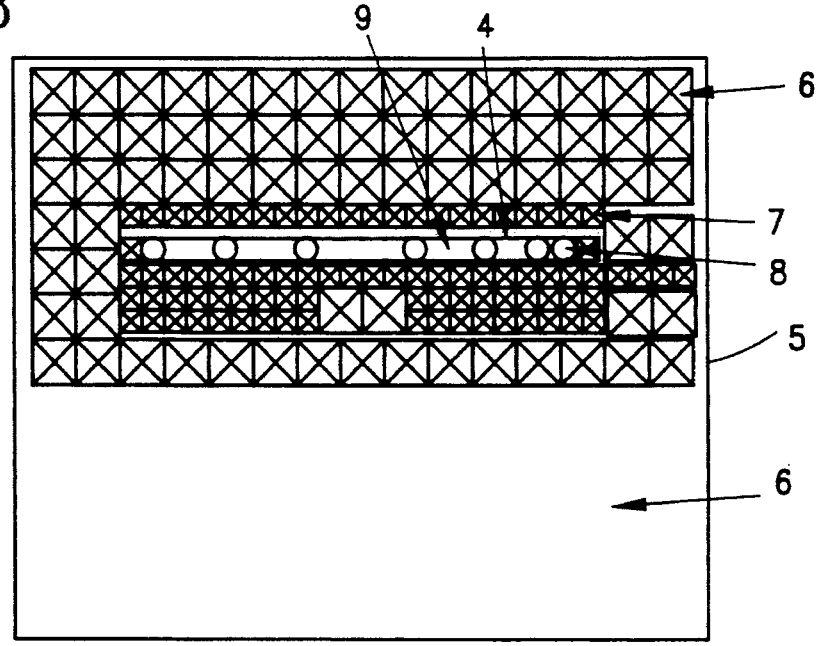

If radio-frequency absorbers (6, 7) with a low carbon fraction are used, the capacitive loading of the resistor termination is reduced. An additional improvement is achieved by means of an air gap (9), compare FIGS. 2–4, between the tubular resistors (8) and radio-frequency absorbers (6, 7). Said gap is typically approximately 10 cm–15 cm for a standard TEM waveguide arrangement (10). Since the current density (I(x)) at the edge of the inner conductor (4) is much higher than in the middle, the air gap (9) there must be additionally enlarged, compare FIG. 2. If the air gap (9) is made too large, increased reflections from the rear wall (5) have to be expected. A compromise is achieved when the air gap (9) is additionally filled up with a number of much shorter RF short-point absorbers (7) mounted directly on the rear wall (5), compare FIG. 3. As a result, the reflections are minimized in the case of higher frequencies and the capacitive loading is increased only insubstantially.

Since the capacitive influence on the resistive load has been minimized, it is possible to neglect longitudinal matching of the resistive load to the capacitance per unit length of the radio-frequency absorbers (6, 7) which is used in the case of a standard TEM waveguide arrangement (10). The resistor termination can therefore be designed with a constant resistance in the longitudinal direction (z). The current density (I(x)) prevailing on the inner conductor (4) in the transverse direction (x) must, however, be taken into account as before by means of a shorter spacing of adjacent tubular resistors (8) in the edge regions.

Figure 4:
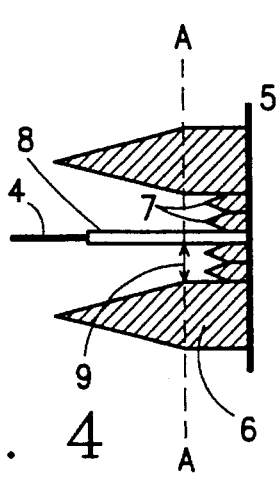
FIG. 4 shows details of a longitudinal section through radio-frequency absorbers in the region of the inner conductor termination.

FIG. 4 shows a detail of the connection of the inner conductor (4) to the rear wall (5) via a tubular resistor (8) by means of 2 RF short-point absorbers (7) adjacent to the tubular resistor (8) and a large air gap (9) between the tubular resistor (8) and an adjacent RF long-point absorber (6).

Figure 5:
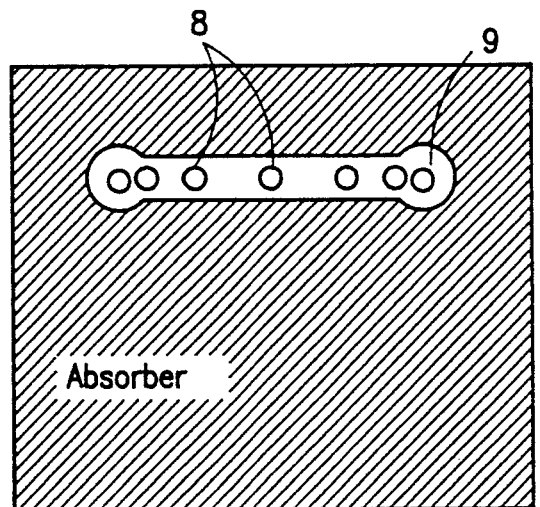
FIG. 5 shows a cross section through radio-frequency absorbers along the line A—A in FIG. 4.

FIG. 5 shows a sectional view along a line A—A in FIG. 4 in the direction looking right. It is seen that the spacings of the tubular resistors (8) are shorter at the edge than in the middle.

FIG. 6 shows the course (11) of the current density (I(x)) in the inner conductor (4). Matching to the existing current density (I(x)) can be achieved either by differently dimensioned resistors (8) which have the same lateral spacing and whose current loading or loadability, corresponds to the differing current density (I(x)), or preferably by tubular resistors (8) having the same dimensions and at a spacing which corresponds to the course (11) of the current density (I(x)). The placing of the tubular resistors (8) is determined by the breakdown of the current distribution into regions (12) of the same current density, compare FIG. 7.

It goes without saying that instead of radio-frequency absorbers (6, 7) of pyramidal shape it is also possible to use differently shaped, for example cone-shaped, radio-frequency absorbers without points. It is important that the tubular resistors (8) can dissipate their heat losses effectively.

Instead of being constructed in the shape of a plate, the inner conductor (4) can also be constructed in the shape of a wire.

Obviously, numerous modifications and variations of the present invention are possible in the light of the above teachings. It is therefore to be understood that within the scope of the appended claims, the invention may be practiced otherwise than as specifically described herein.

What is claimed as new and desired to be secured by Letters Patent of the United States is:

1. A TEM waveguide arrangement comprising:
    a) at least one outer conductor, and
    b) at least one inner conductor,
    c) first radio-frequency absorbers for absorbing field-bound energy, which extend from a rear wall of the TEM waveguide arrangement into art interior of the TEM waveguide arrangement via a transition region of prescribable length, and
    d) electrical resistors which electrically connect the inner conductor to the rear wall of the TEM waveguide arrangement, for absorbing conductor-bound energy of TEM waves, wherein
    e) the electrical resistors are tubular and
    f) the first radio-frequency absorbers are at a prescribable distance from said resistors, and wherein second radio-frequency absorbers which are shorter than said first radio frequency absorbers separate the electrical resistors from the first radio frequency absorbers, said first radio frequency absorbers being mounted on the rear wall.

2. The TEM waveguide arrangement as claimed in claim 1, wherein the electrical resistors have a minimum spacing from adjacent ones of said first radio-frequency absorbers in a range of 10 cm–15 cm.

3. The TEM waveguide arrangement as claimed in claim 2, wherein mutual lateral spacing of the electrical resistors corresponds to a course of a current density (I(x)) in the inner conductor in such a way that the electrical resistors are arranged closer to one another at locations with a higher current density (I(x)) than at locations with a lower current density (I(x)).

4. The TEM waveguide arrangement as claimed in claim 2, wherein loadability of the electrical resistors corresponds to a course of a current density (I(x)) in the inner conductor in such a way that the electrical resistors can be loaded more heavily in regions of higher current density (I(x)) than in regions of lower current density (I(x)).

5. The TEM waveguide arrangement as claimed in claim 1, wherein mutual lateral spacing of the electrical resistors corresponds to a course of a current density (I(x)) in the inner conductor in such a way that the electrical resistors are arranged closer to one another at locations with a higher current density (I(x)) than at locations with a lower current density (I(x)).

6. The TEM waveguide arrangement as claimed in claim 1, wherein loadability of the electrical resistors corresponds to a course of a current density (I(x)) in the inner conductor in such a way that the electrical resistors can be loaded more heavily in regions of higher current density (I(x)) than in regions of lower current density (I(x)).

7. A TEM waveguide arrangement as claimed in claim 1 wherein said first radio-frequency absorbers are radio-frequency long-point absorbers.

8. A TEM waveguide arrangement comprising:
    a) at least one outer conductor, and
    b) at least one inner conductor,
    c) first radio-frequency absorbers for absorbing field-bound energy, which extend from a rear wall of the TEM waveguide arrangement into an interior of the TEM waveguide arrangement via a transition region of prescribable length, and
    d) electrical resistors which electrically connect the inner conductor to the rear wall of the TEM waveguide arrangement, for absorbing conductor-bound energy of TEM waves, wherein
    e) the electrical resistors are tubular and
    f) the first radio-frequency absorbers are at a prescribable distance from said resistors, and wherein the electrical resistors are connected electrically to the rear wall and directly mounted on the rear wall in a planar fashion.

9. The TEM waveguide arrangement as claimed in claim 8, wherein the electrical resistors have a minimum spacing from adjacent ones of said first radio-frequency absorbers in a range of 10 cm–15 cm.

10. The TEM waveguide arrangement as claimed in claim 8, wherein mutual lateral spacing of the electrical resistors corresponds to a course of a current density (I(x)) in the inner conductor in such a way that the electrical resistors are arranged closer to one another at locations with a higher current density (I(x)) than at locations with a lower current density (I(x)).

11. The TEM waveguide arrangement as claimed in claim 8, wherein loadability of the electrical resistors corresponds to a course of a current density (I(x)) in the inner conductor in such a way that the electrical resistors can be loaded more heavily in regions of higher current density (I(x)) than in regions of lower current density (I(x)).

12. A TEM waveguide arrangement as claimed in claim 6 wherein said first radio-frequency absorbers are radio-frequency long-point absorbers.

* * * * *